United States Patent
Taniguchi et al.

(10) Patent No.: US 9,013,250 B2
(45) Date of Patent: Apr. 21, 2015

(54) ACOUSTIC WAVE DEVICE AND FILTER

(75) Inventors: Shinji Taniguchi, Tokyo (JP); Tokihiro Nishihara, Tokyo (JP); Tsuyoshi Yokoyama, Tokyo (JP); Takeshi Sakashita, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 488 days.

(21) Appl. No.: 13/362,753

(22) Filed: Jan. 31, 2012

(65) Prior Publication Data

US 2012/0200373 A1 Aug. 9, 2012

(30) Foreign Application Priority Data

Feb. 8, 2011 (JP) ................. 2011-025488

(51) Int. Cl.
| | |
|---|---|
| *H03H 9/15* | (2006.01) |
| *H03H 9/54* | (2006.01) |
| *H03H 9/02* | (2006.01) |
| *H03H 9/58* | (2006.01) |
| *H03H 9/17* | (2006.01) |
| *H03H 3/04* | (2006.01) |
| *H03H 3/02* | (2006.01) |

(52) U.S. Cl.
CPC ........... *H03H 9/02086* (2013.01); *H03H 9/582* (2013.01); *H03H 9/02157* (2013.01); *H03H 3/04* (2013.01); *H03H 9/173* (2013.01); *H03H 2003/021* (2013.01); *H03H 2003/0442* (2013.01); *H03H 2003/0471* (2013.01); *H03H 2003/045* (2013.01)

(58) Field of Classification Search
CPC .......... H03H 9/02086; H03H 9/02157; H03H 9/173; H03H 9/582; H03H 3/04; H03H 2003/021; H03H 2003/0442; H03H 2003/0471; H03H 2003/045
USPC .................................. 333/187–189; 310/312
See application file for complete search history.

(56) References Cited

U.S. PATENT DOCUMENTS

| | | | |
|---|---|---|---|
| 6,657,363 B1 | 12/2003 | Aigner | |
| 7,236,066 B2 * | 6/2007 | Ebuchi | ........................ 333/187 |
| 2002/0030420 A1 * | 3/2002 | Tsukai et al. | ................ 310/320 |
| 2002/0123177 A1 | 9/2002 | Ruby et al. | |

(Continued)

FOREIGN PATENT DOCUMENTS

| | | |
|---|---|---|
| CN | 1604469 A | 4/2005 |
| CN | 101170303 A | 4/2008 |

(Continued)

OTHER PUBLICATIONS

Chinese Office Action dated May 7, 2014, in a counterpart Chinese patent application No. 201210027528.9.

(Continued)

*Primary Examiner* — Barbara Summons
(74) *Attorney, Agent, or Firm* — Chen Yoshimura LLP

(57) ABSTRACT

An acoustic wave device including: a substrate; a piezoelectric film formed on the substrate; an lower electrode provided on a first surface of the piezoelectric film; an upper electrode provided on a second surface of the piezoelectric film opposite to the first surface; and a mass loading film having a first pattern and a second pattern in a resonance portion in which the lower electrode and the upper electrode face each other through the piezoelectric film, the first pattern having portions and the second pattern having portions interlinking the portions of the first pattern.

17 Claims, 16 Drawing Sheets

(56) References Cited

U.S. PATENT DOCUMENTS

| | | |
|---|---|---|
| 2005/0093395 A1 | 5/2005 | Wachi et al. |
| 2005/0248420 A1 | 11/2005 | Ma et al. |
| 2008/0143215 A1 | 6/2008 | Hara et al. |
| 2008/0150653 A1* | 6/2008 | Hara et al. .............. 333/187 |
| 2008/0169885 A1 | 7/2008 | Ueda et al. |
| 2008/0290969 A1* | 11/2008 | Yamakawa et al. ......... 333/197 |
| 2009/0153267 A1* | 6/2009 | Lutz et al. ............... 333/186 |
| 2009/0206706 A1 | 8/2009 | Iwaki et al. |
| 2010/0045145 A1 | 2/2010 | Tsuda |
| 2010/0277034 A1* | 11/2010 | Sinha et al. .............. 310/312 |
| 2011/0241800 A1 | 10/2011 | Yokoyama et al. |

FOREIGN PATENT DOCUMENTS

| | | |
|---|---|---|
| JP | 2002-515667 A | 5/2002 |
| JP | 2002-335141 A | 11/2002 |
| JP | 2007-535279 A | 11/2007 |
| JP | 2008-172494 A | 7/2008 |
| JP | 2008-244653 A | 10/2008 |
| JP | 2009-27554 A | 2/2009 |
| JP | 2009-124583 A | 6/2009 |
| JP | 2009-200714 A | 9/2009 |
| JP | 2009-246569 A | 10/2009 |
| WO | 2005/114836 A1 | 12/2005 |
| WO | 2007/000929 A1 | 1/2007 |
| WO | 2010/061479 A1 | 6/2010 |

OTHER PUBLICATIONS

Japanese Office Action dated Jun. 3, 2014, in a counterpart Japanese patent application No. 2011-025488.

Chinese Office Action dated Jan. 19, 2015, in a counterpart Chinese patent application No. 201210027528.9.

* cited by examiner

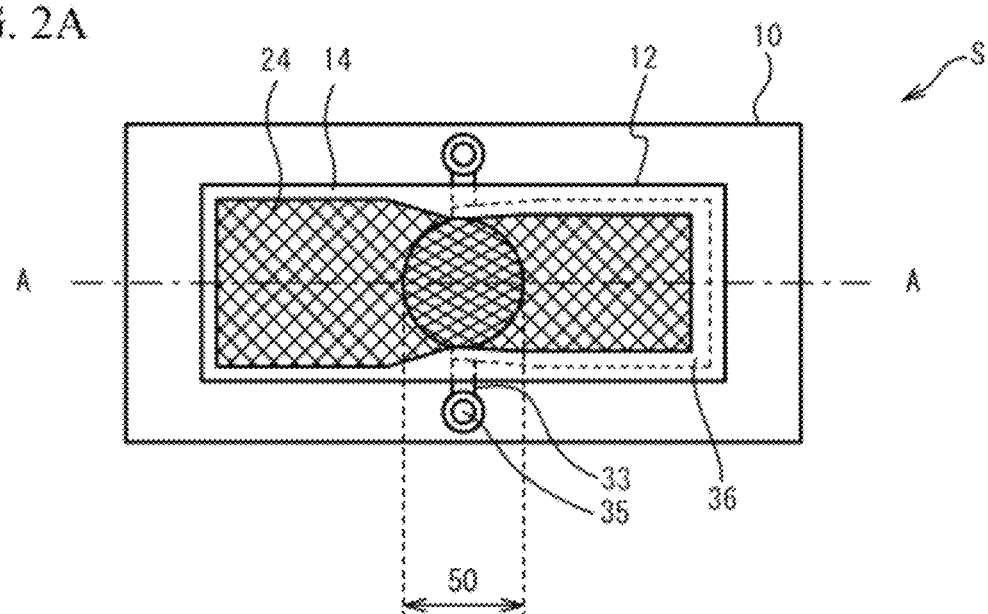
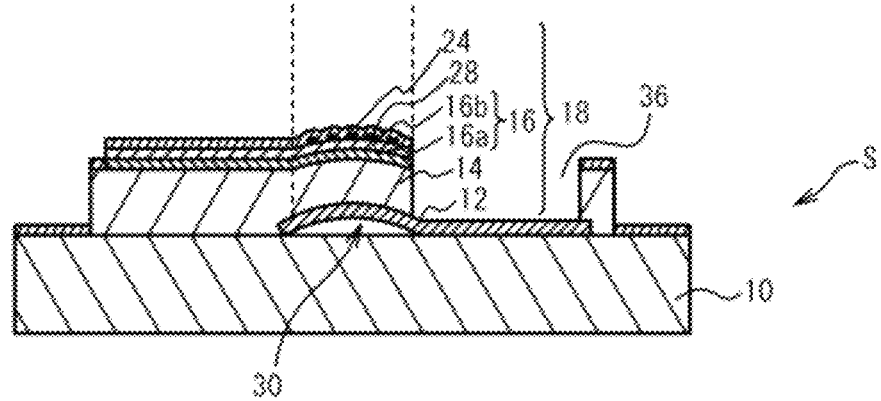
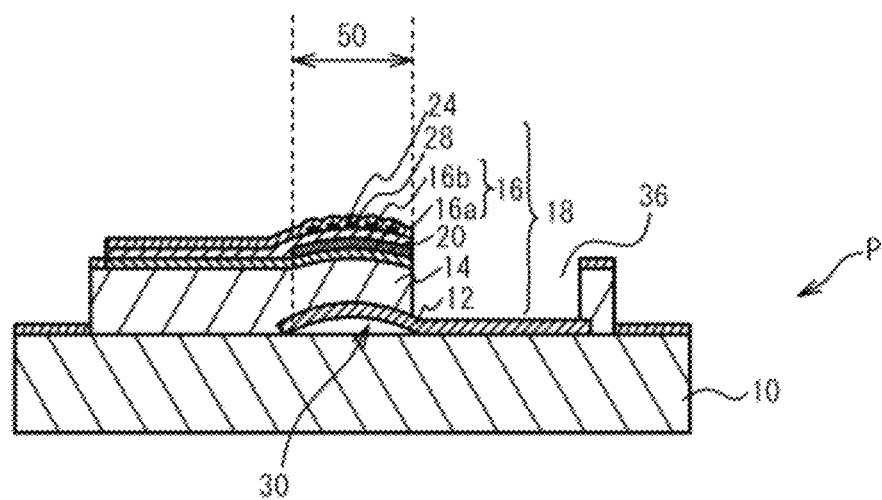

ACOUSTIC WAVE DEVICE AND FILTER

CROSS-REFERENCE TO RELATED APPLICATION

This application is based upon and claims the benefit of priority of the prior Japanese Patent Application No. 2011-025488, filed on Feb. 8, 2011, the entire contents of which are incorporated herein by reference.

FIELD

A certain aspect of the present invention relates to acoustic wave devices and filters. Another aspect of the present invention relates to an acoustic wave device including a piezoelectric thin-film resonator and a filer using such an acoustic wave device.

BACKGROUND

An acoustic wave device using a piezoelectric thin-film resonator is used as a filter provided in wireless communication equipment. The piezoelectric thin-film resonator includes a film buck acoustic resonator (FBAR) and is configured to have a piezoelectric thin-film having opposite surfaces on which upper and lower electrodes are respectively provided. The resonance frequency of the piezoelectric thin-film resonator depends on the thickness of a portion in which the upper and lower electrodes face each other through the piezoelectric thin-film. Such a portion is referred to as a resonance portion. In a case where the upper and lower electrodes are respectively made of different materials, the resonance frequency of the resonance portion depends on the materials as well as the film thickness.

Japanese Patent Application Publication No. 2002-335141 (Document 1) discloses an art in which a mass loading film is formed in the resonance portion in order to change the resonance frequency of the piezoelectric thin-film resonator. Documents 2 through 5 described below disclose an art of forming an opening in the mass loading film in the resonance portion (Document 2: Japanese Patent Application Publication No. 2002-515667, Document 3: U.S. Pat. No. 6657363, Document 4: Japanese Patent Application Publication No. 2008-172494, and Document 5: International Publication No. 2010/061479). Japanese Patent Application Publication No. 2007-535279 (Document 6) discloses an art of forming a stripe-shaped mass loading film in the resonance portion. According to Documents 1 through 6, the resonance frequency is adjusted for each resonator.

According to the art disclosed in Document 1, resonators having different resonance frequencies are realized by forming mass loading films having different thicknesses. Such mass loading films are formed by performing a series of a film growing process, a photolithography process and an etching process multiple times. This complicates the manufacturing process and increases the production cost. According to Documents 2 through 6, the presence of the mass loading film in the resonance portion formed by patterning increases the spurious intensity, which leads to a deterioration of the resonance characteristic. As a result, the frequency adjustable range becomes narrow.

SUMMARY OF THE INVENTION

According to an aspect of the present invention, it is an object to suppress a deterioration of the resonance characteristic.

According to another aspect of the present invention, there is provided an acoustic wave device including: a substrate; a piezoelectric film formed on the substrate; an lower electrode provided on a first surface of the piezoelectric film; an upper electrode provided on a second surface of the piezoelectric film opposite to the first surface; and a mass loading film having a first pattern and a second pattern in a resonance portion in which the lower electrode and the upper electrode face each other through the piezoelectric film, the first pattern having portions and the second pattern having portions interlinking the portions of the first pattern.

BRIEF DESCRIPTION OF THE DRAWINGS

FIG. 2A is a plan view of a piezoelectric thin-film resonator used in a first embodiment,
FIG. 2B is a cross-sectional view of a series resonator used in the first embodiment,
and FIG. 2C is a cross-sectional view of a parallel resonator used in the first embodiment.

DETAILED DESCRIPTION

Embodiments of the invention are now described with reference to the accompanying drawings.

First Embodiment

Figure 1:
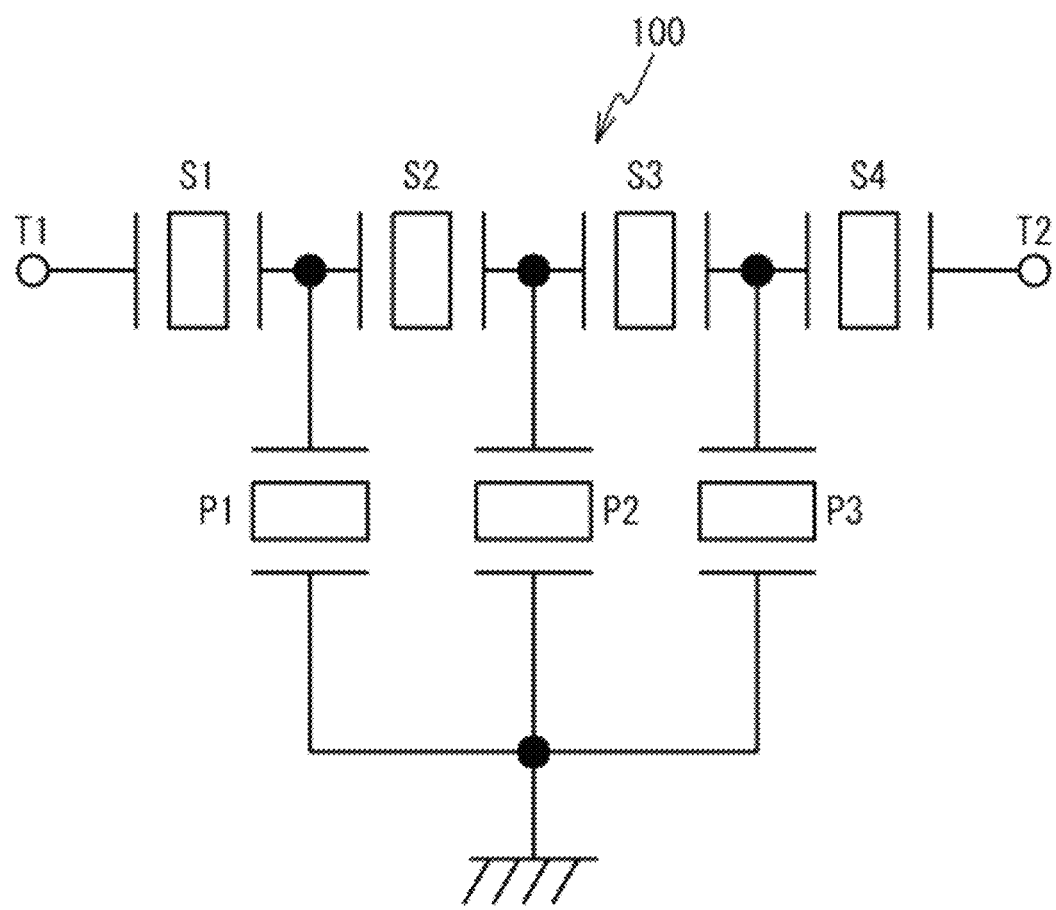
FIG. 1 is a circuit diagram of a ladder type filter.

First, a description is given of an exemplary ladder type filter using an acoustic wave device in accordance with a first embodiment. FIG. 1 is a circuit diagram of such a ladder type filter. Referring to FIG. 1, a ladder type filter 100 is composed of series resonators S1~S4 and parallel resonators P1~P3. The series resonators S1~S4 are connected in series with each other between an input/output terminal T1 and an input/output terminal T2. The parallel resonators P1~P3 are connected in parallel with each other between the input/output terminals T1 and T2.

FIG. 2A is a plan view of a piezoelectric thin-film resonator in accordance with the first embodiment, FIG. 2B is a cross-sectional view taken along a line A-A in FIG. 2A in which the piezoelectric thin-film resonator is a series resonator S, and FIG. 2C is a cross-sectional view taken along the line A-A in which the resonator in FIG. 2A is a parallel resonator P. Referring to FIGS. 2A and 2B, the series resonator S is configured as follows. A lower electrode 12 is provided on a substrate 10 made of, for example, silicon, so that a cavity 30 shaped into a dome can be defined between the lower electrode 12 and a flat surface of the substrate 10. The dome-shaped cavity 30 defines a dome-shaped portion of the lower electrode 12. The dome-shaped cavity 30 has a relatively small height in the periphery and has an increasing height towards the center. The lower electrode 12 may include a chromium (Cr) layer and a ruthenium (Ru) layer provided on the Cr layer.

A piezoelectric film 14 is provided on the lower electrode 12. The piezoelectric film 14 may be made of aluminum nitride (AlN) having the main axis in the (002) direction. An upper electrode 16 is provided on the piezoelectric film 14 so as to have an area in which the upper electrode 16 faces the lower electrode 12 through the piezoelectric film 14. The above area is defined as a resonance portion 50. The upper electrode 16 may have a Ru layer 16a and a Cr layer 16b formed on the Ru layer. As described above, the piezoelectric film 14 is provided on the substrate 10, and is sandwiched between the lower electrode 12 and the upper electrode 16, which have portions that overlap each other through the piezoelectric film 14.

A mass loading film 28, which may be a titanium (Ti) layer, for example, is provided on the upper electrode 16 and is located in the resonance portion 50. A silicon oxide film is provided, as a frequency adjustment film 24, on the upper electrode 16 and the mass loading film 28. A multilayered film 18 includes the lower electrode 12, the piezoelectric film 14, the upper electrode 16, the mass loading film 28 and the frequency adjustment film 24.

An introduction path 33 used for etching a sacrificed layer is formed in the lower electrode 12. The sacrificed layer is a layer for forming the cavity 30. Ends of the introduction path 33 are not covered with the piezoelectric film 14. The lower electrode 12 has holes 35 at the ends of the introduction path 33. As illustrated in FIGS. 2A and 2B, an opening 36 for making an electric connection with the lower electrode 12 is formed in the piezoelectric film 14.

Referring to FIGS. 2A and 2C, the parallel resonator P is configured as follows. The parallel resonator P differs from the series resonator S in that the parallel resonator P has a mass loading film 20 made of Ti, for example, is provided between the Ru layer 16a and the Cr layer 16b. Thus, the multilayered film 18 of the parallel resonator P includes the mass loading film 20 in the resonance portion 50 in addition to the stacked layers of the series resonator S. The other structures of the parallel resonator P are the same as those of the series resonator S illustrated in FIG. 2B, and a description thereof is omitted here.

In FIGS. 2B and 2C, the mass loading film 28 is formed between the upper electrode 16 and the frequency adjustment film 24. As another example, the mass loading film 28 may be formed within the multilayered film 18 in the resonance portion 50. For example, the mass loading film 28 may be formed on the frequency adjustment film 24. The upper electrode 16 may be formed by a plurality of layers, and the mass loading film 28 may be formed between adjacent ones of the plurality of layers. The mass loading film 28 may be formed between the piezoelectric film 14 and the upper electrode 16. The mass loading film 28 may be formed between the lower electrode 12 and the piezoelectric film 14. The lower electrode 12 may be formed by a plurality of layers, and the mass loading film 28 may be formed between adjacent ones of the plurality of layers. The mass loading film 28 may be formed below the lower electrode 12.

In a case there the piezoelectric thin-film resonator has a resonance frequency of 2 GHz, the Cr layer and the Ru layer of the lower electrode 12 are respectively 100 nm thick and 200 nm thick, and the piezoelectric film 14 formed by the AlN layer is 1250 nm thick. Further, the Ru layer 16a is 250 nm thick, the Cr layer 16b is 20 nm thick, and the mass loading film 28 formed by the Ti layer is 25 nm thick. The mass loading film 20 formed by the Ti layer is 125 nm thick. The thickness of each of the above layers may be selected to obtain a desired resonance frequency.

Besides Cr and Ru, the lower electrode 12 and the upper electrode 16 may be formed by a metal film of aluminum (Al), copper (Cu), molybdenum (Mo), tungsten (W), tantalum (Ta), platinum (Pt), rhodium (Rh) or iridium (Ir), or a composite film thereof. The mass loading films 20 and 28 are not limited to Ti, but may be formed by a metal film of Ru, Cr, Al, Cu, Mo, W, Ta, Pt, Rh or Ir, or a composite film thereof. Further, the mass loading films 20 and 28 may be an insulation film such as a metal nitride such as silicon nitride or a metal oxide such as silicon oxide. For the purpose of reducing the resistance, metal films are preferably used to form the mass loading films 20 and 28 in a case where the mass loading films 20 and 28 are provided between the adjacent layers of the lower electrode 12, between those of the upper electrode 16, between the lower electrode 12 and the piezoelectric film 14, or between the piezoelectric film 14 and the upper electrode 16.

The substrate 10 is not limited to the silicon substrate but may be a silica substrate, glass substrate, ceramic substrate or GaAs substrate. The piezoelectric film 14 is not limited to AlN but may be made of zinc oxide (ZnO), lead zirconate titanate (PZT) or lead titanate ($PbTiO_3$).

The lower electrode 12, the piezoelectric film 14, the upper electrode 16 and the mass loading films 20 and 28 may be formed by sputtering and etching. Thereafter, the films are formed into desired shapes by photolithography and etching. The films may be formed by deposition and liftoff. When the multilayered film 18 has a compression stress, the dome-shaped cavity 30 can be defined.

Figure 3A:
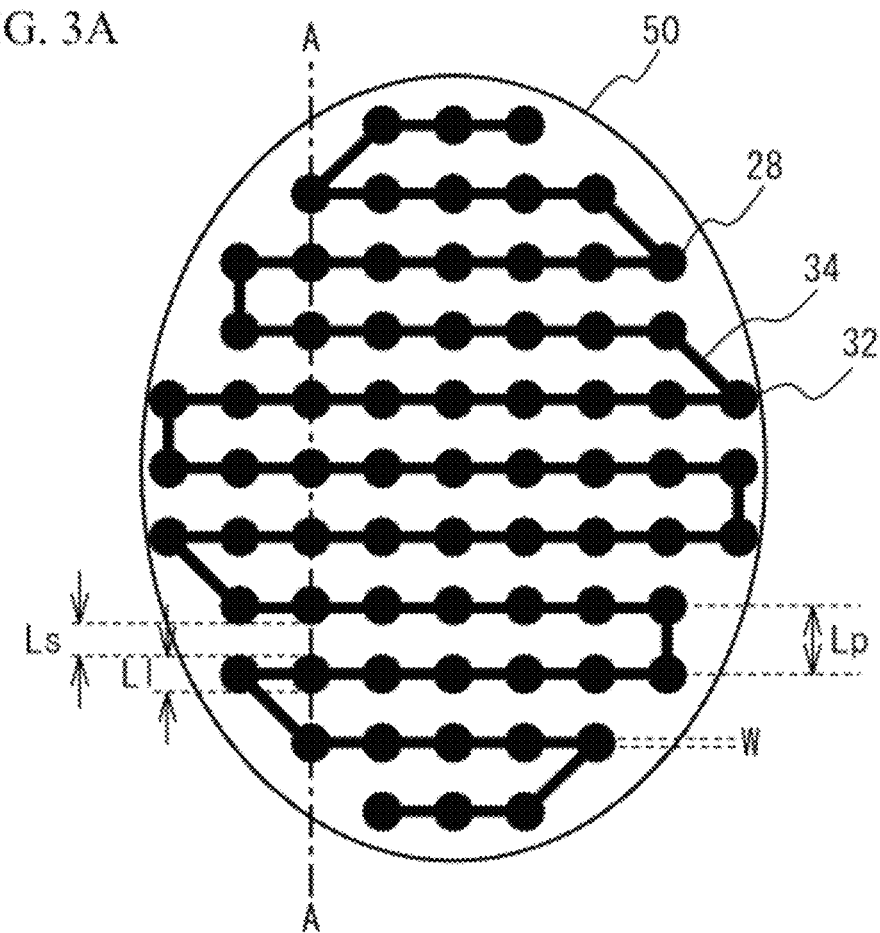
FIG. 3A is a plan view of an exemplary mass loading film.
Figure 3B:
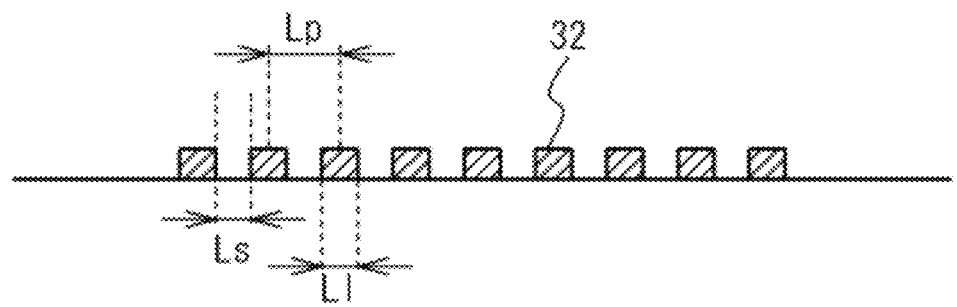
FIG. 3B is a cross-sectional view taken along a line A-A in FIG. 3A.

FIG. 3A is a plan view of an exemplary structure of the mass loading film 28, and FIG. 3B is a cross-sectional view taken along a line A-A in FIG. 3A. Referring to FIGS. 3A and 3B, the mass loading film 28 has a first pattern 32 and a second pattern 34 in the resonance portion 50. The resonance portion 50 has an ellipsoidal shape. The first pattern 32 is a pattern of dots arranged regularly or periodically. The second pattern 34 is a pattern of arms that interlink the dots of the first pattern 32. The dots of the first pattern 32 may have a circular shape, and the arms of the second pattern 34 may have a rod shape. The second pattern 34 interlinks the first pattern 32 in a zigzag manner. The first pattern 32 and the second pattern 34 in FIGS. 3A and 3B are formed from the mass loading film 28. It is assumed that L1 is the size of each dot of the first pattern 32, Ls is the interval or space between the adjacent dots of the first pattern 28, Lp is the pitch of the first pattern 32, and W is the width of each rod of the second pattern 34. The size L1 of the first pattern 32 is greater than the width W of the second pattern 34. A coverage ratio is defined as a ratio of the area of the mass loading film 28 to that of the resonance portion 50.

Figure 4A:
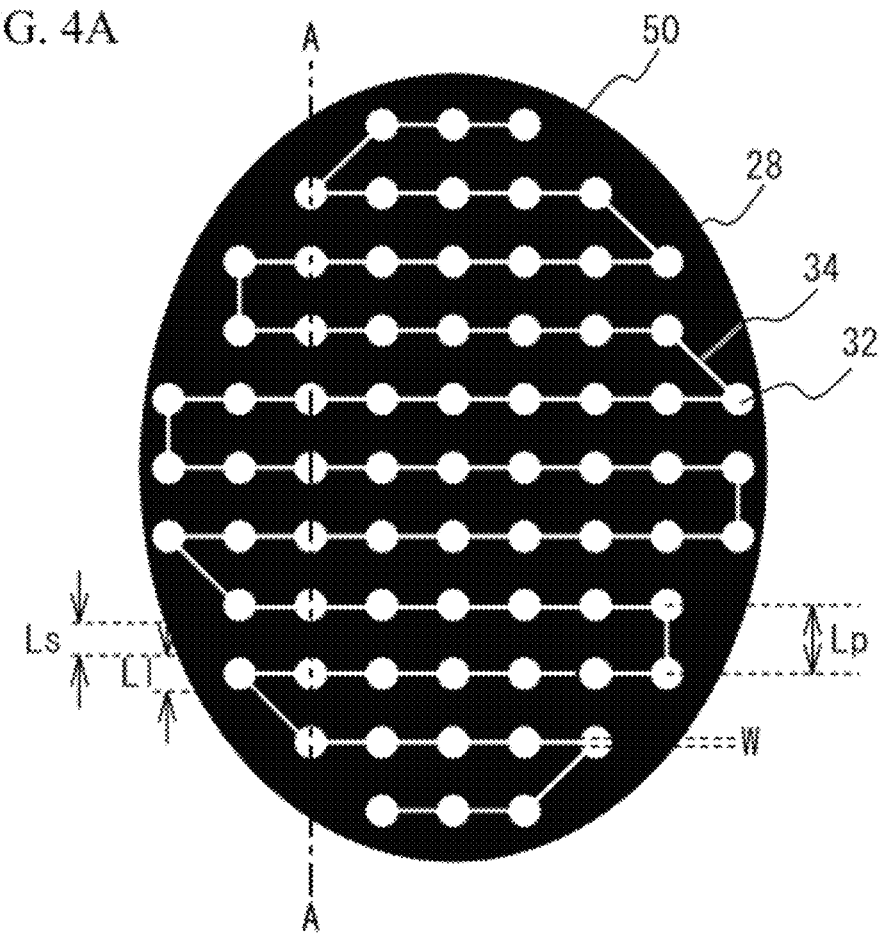
FIG. 4A is a plan view of another exemplary mass loading film.
Figure 4B:
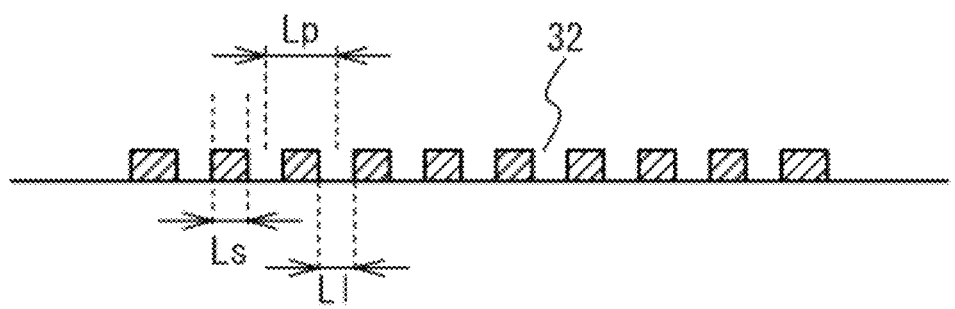
FIG. 4B is a cross-sectional view taken along a line A-A in FIG. 4A.

FIG. 4A is a plan view of another example of the mass loading film 28, and FIG. 4B is a cross-sectional view taken along a line A-A in FIG. 4A. Referring to FIGS. 4A and 4B, the first pattern 32 and the second pattern 34 are formed in the resonance portion 50. The first pattern 32 is a pattern of dots arranged regularly. The second pattern 34 is a pattern that interlinks the dots of the first pattern 32. The second pattern 34 interlinks the first pattern 32 in a zigzag manner. The first pattern 32 and the second pattern 34 of FIGS. 4A and 4B are patterns defined by holes formed in the mass loading film 28. That is, the first pattern 32 and the second pattern 34 in FIGS. 4A and 4B have a complementary relationship to those in FIGS. 3A and 3B. It is assumed that L1 is the size of each dot of the first pattern 32, Ls is the interval between the adjacent dots of the first pattern 28, Lp is the pitch of the first pattern 32, and W is the width of each rod of the second pattern 34. The size L1 of the first pattern 32 is greater than the width W of the second pattern 34.

Figure 5A:
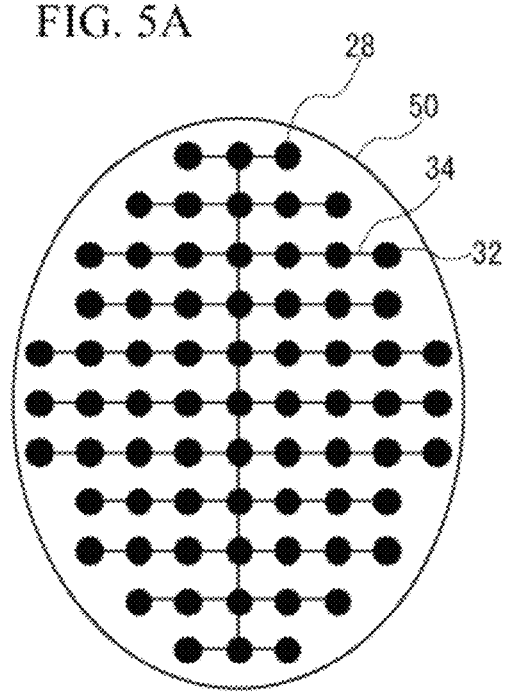
FIGS. 5A through 5D are plan views of exemplary first and second patterns.
Figure 5B:
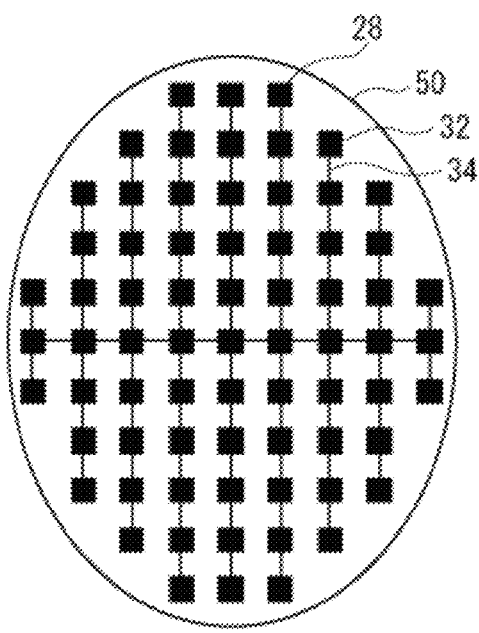
Figure 5C:
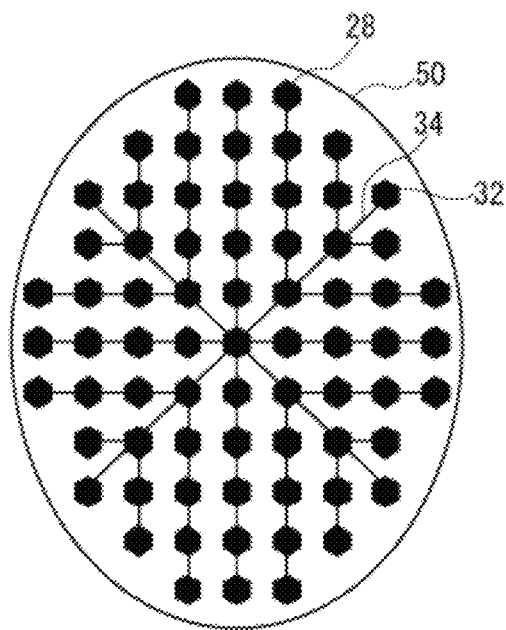
Figure 5D:
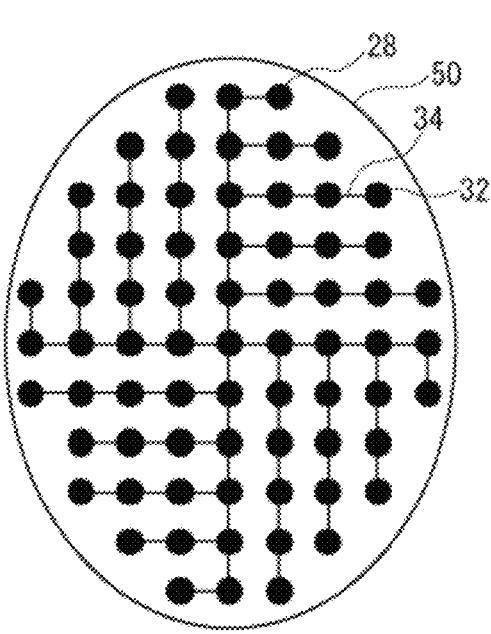

FIGS. 5A through 5D and FIGS. 6A through 6D are plan views of examples of the first and second patterns 32 and 34. In FIG. 5A, the first pattern 32 has circular dots. The second pattern 34 interlinks the dots of the first pattern 32 on the long axis of the ellipsoidal resonance portion 50. The dots of the first pattern 32 are interlinked in the short-axis direction by the second pattern 34. In FIG. 5B, the first pattern 32 has rectangular dots. The second pattern 34 interlinks the dots of the first pattern 32 on the short axis of the ellipsoidal resonance portion 50. The dots of the first pattern 32 are interlinked in the long-axis direction by the second pattern 34. In FIG. 5C, the first pattern 32 has hexagonal dots. The second pattern 34 interlinks the dots of the first pattern 32 obliquely with respect to the short-axis and long-axis directions. The dots of the first pattern 32 are interlinked in the short-axis and long-axis directions by the second pattern 34 starting from the dots interlinked obliquely. In FIG. 5D, the first pattern 32 has circular dots. The second pattern 34 interlinks the dots of the first pattern 32 on the long and short axes of the ellipsoidal resonance portion 50. The dots of the first pattern 32 are interlinked in the short-axis and long-axis directions by the second pattern 34 starting from the dots on the long and short axes of the ellipsoidal resonance portion 50.

Figure 6A:
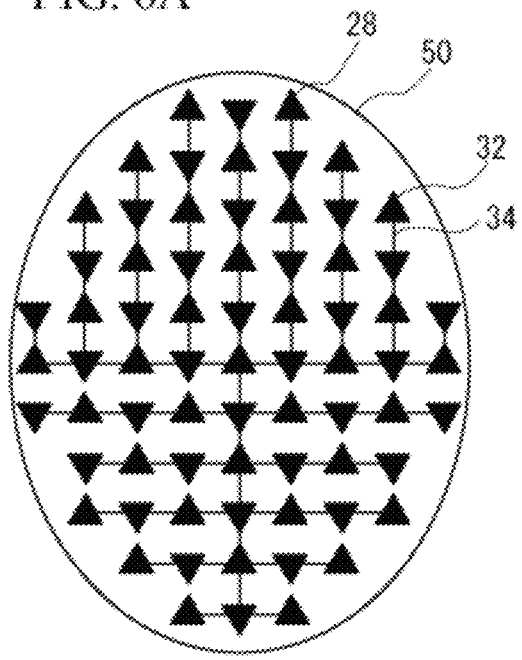
FIGS. 6A through 6D are plan views of different exemplary first and second patterns.
Figure 6B:
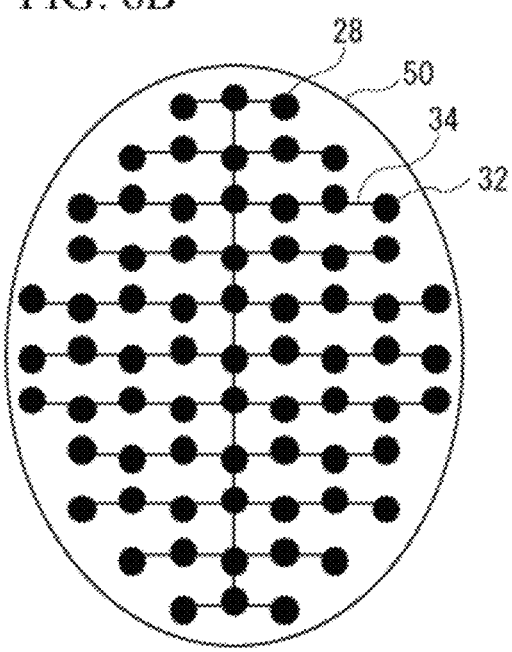
Figure 6C:
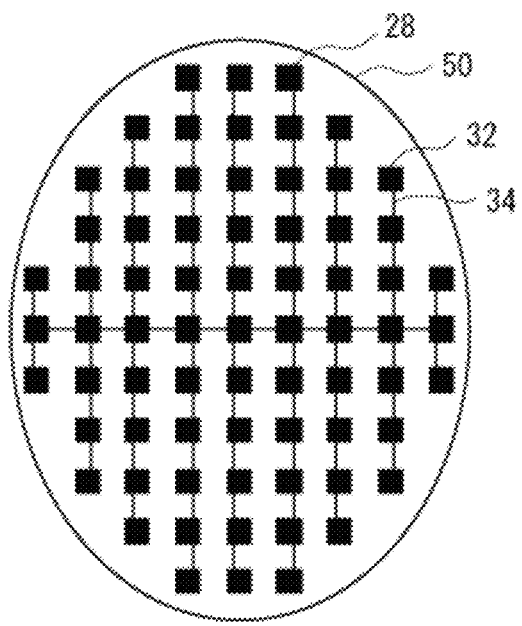
Figure 6D:
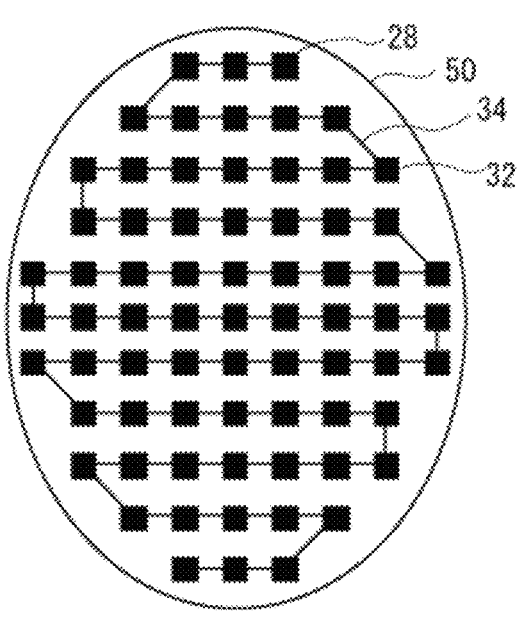

In FIG. 6A, the first pattern 32 has triangular dots. In the upper half of the resonance portion 50, the second pattern 34 interlinks the dots of the first pattern 32 in the long-axis direction. In the lower half of the resonance portion 50, the second pattern 34 interlinks the dots of the first pattern 32 in the short-axis direction. In FIG. 6B, the second pattern 34 has the same shape as that in FIG. 5A. However, the positions of the dots of the first pattern 32 alternately shift from the second pattern 34 in the long-axis direction. In FIG. 6C, the first pattern 32 has the same shape as that in FIG. 5B. However, the positions of the second pattern 34 alternately shift in the short-axis direction. In FIG. 6D, the second pattern 34 is the same as that in FIG. 3A, and the first pattern 32 has rectangular dots. As described above, the first pattern 32 may have an arbitrary shape. The second pattern 34 is required to interlink the dots of the first pattern 32. In FIGS. 3A through 6D, each of the second patterns 34 interlinks all the dots of the first pattern 32. However, the second pattern 34 may be varied so as not to interlink some dots of the first pattern 32. The first pattern 32 is not limited to the regular dot arrangements but may have an irregular arrangement or a random arrangement. The first pattern 32 is not limited to the dots of the same shape and the same size but may have dots having different shapes and/or different sizes. The width W of the second pattern 34 is not limited to the same width but may be different for different dots.

In FIGS. 5A through 6D, the first pattern 32 and the second pattern 34 are formed by the mass loading film 28. By way of another example, the first pattern 32 and the second pattern 34 may be patterns having openings formed on the mass loading film 28.

Figure 7:
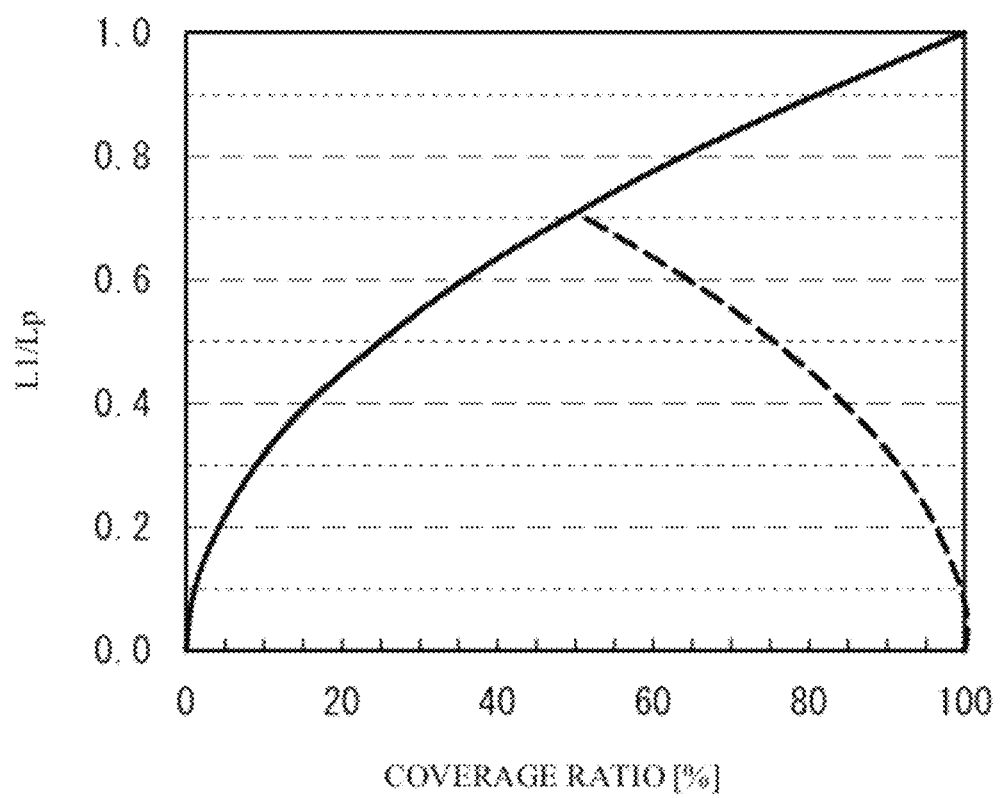
FIG. 7 is a diagram of a pattern size L1/pattern pitch Lp associated with a coverage ratio.

A further description is now given of a case where the first pattern 32 is formed by the mass loading film 28 as illustrated in FIG. 3A, and a case where the first pattern 32 is formed by the mass loading film 28 having the holes as illustrated in FIG. 4A. FIG. 7 illustrates a ratio L1/Lp associated with the coverage ratio where L1 is the pattern size of the first pattern 32 and Lp is the pitch of the first pattern 32. In both the cases, the second pattern 34 is not formed. The first pattern 32 has a square shape. While the pattern pitch Lp is kept constant, and the pattern size L1 is varied and the ratio L1/Lp is calculated in association with the coverage ratio. A solid line indicates the case where the first pattern 32 is formed by the mass loading film 28. A broken line indicates the case where the first pattern 32 is formed by the mass loading film 28 having the holes with a coverage ratio of 50% or higher. As indicated by the solid line in FIG. 7, the ratio L1/Lp increases as the coverage ratio increases. As the pattern size L1 becomes larger, the pattern interval Ls becomes smaller. Thus, it becomes difficult to form the first pattern 32. For example, when the coverage ratio is equal to or higher than 50%, the first pattern 32 is formed by the mass loading film 28 having the holes, as indicated by the broken line. Therefore, it becomes easy to form the first pattern 32 of the mass loading film 28 for a high coverage ratio over 50%.

Figure 8A:
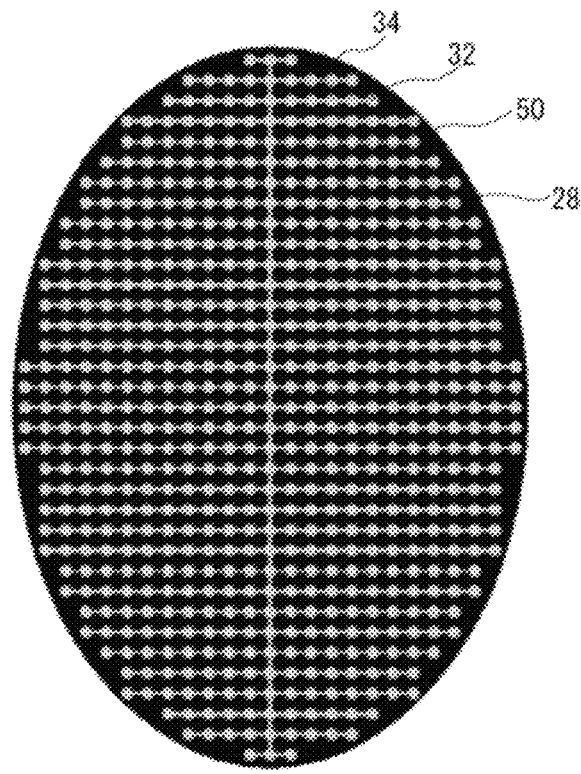
FIG. 8A is a plan view of a resonance portion employed in the first embodiment.
Figure 8B:
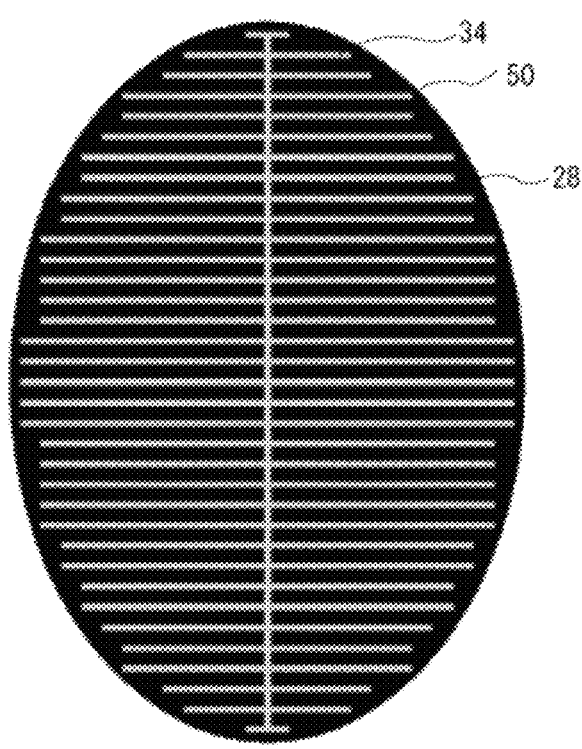
FIG. 8B is a plan view of a resonance portion employed in a first comparative example.

FIG. 8A is a plan view of a resonator actually manufactured in accordance with the first embodiment, and FIG. 8B is a plan view of resonator actually manufactured in accordance with a first comparative example. Referring to FIG. 8A, a resonance portion 50 has an ellipsoidal shape having a long-axis length of 247 μm and a short-axis length of 176 μm. The first pattern 32 and the second pattern 34 are patterns of the mass loading film 28 having the holes. The first pattern 32 has dots of a circular shape. The pattern pitch Lp of the first pattern 32 is 7 μm, and the pattern size L1 thereof is 4.6 μm. The width W of the second pattern 34 is 1.5 μm. The coverage ratio is 60%. Referring to FIG. 8B, the resonance portion 50 of the first comparative example has the same size as that of the first embodiment. The first pattern 32 is not formed but only the second pattern 34 is formed. The width of the second pattern 34 is 2.5 μm, and the coverage ratio is 60% as in the case of the first embodiment.

Figure 9A:
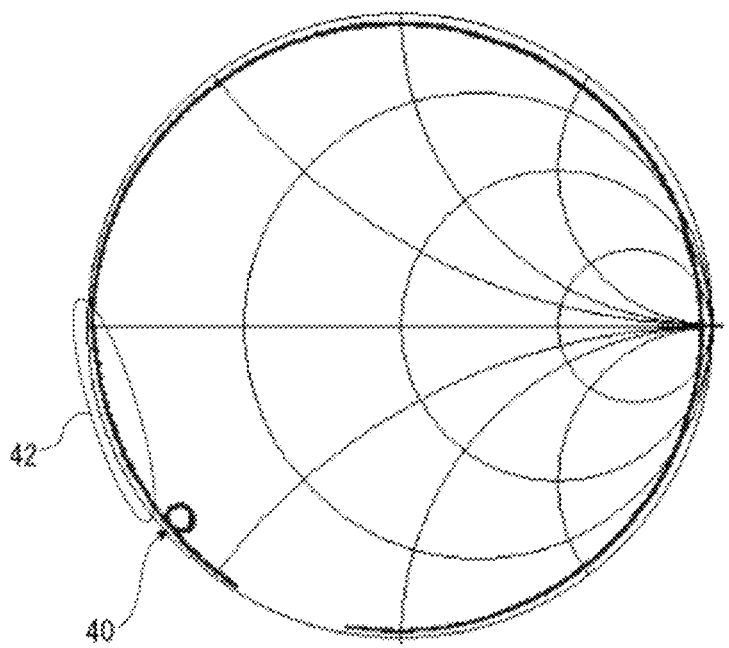
FIGS. 9A and 9B are Smith charts of the reflection characteristics of resonators of the first embodiment and the first comparative example, respectively.
Figure 9B:
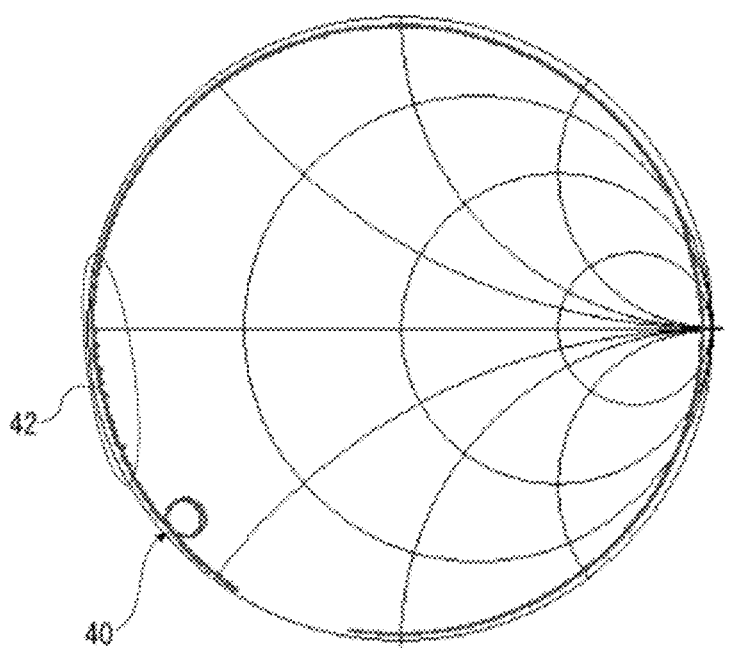
Figure 10A:
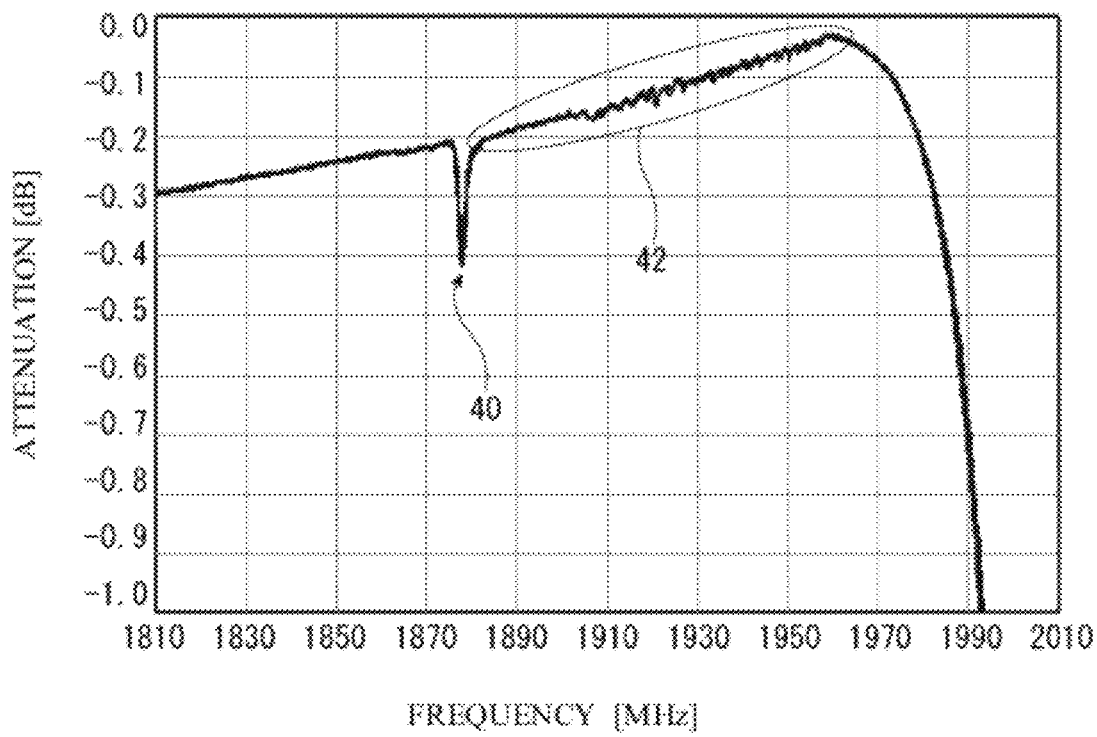
FIGS. 10A and 10B are diagrams of pass characteristics of the resonators of the first embodiment and the first comparative example, respectively.
Figure 10B:
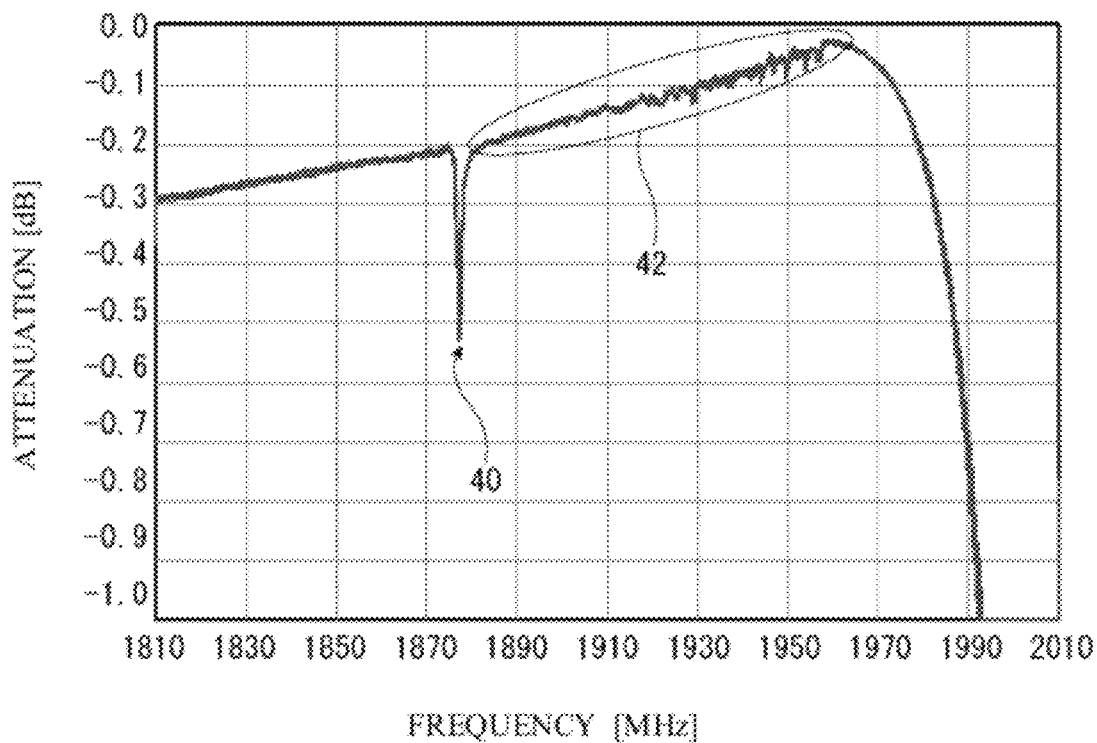

FIG. 9A is a Smith chart of a reflection characteristic of the resonator of the first embodiment, and FIG. 9B is a Smith chart of a reflection characteristic of the resonator of the first comparative example. FIG. 10A is a diagram of a pass characteristic of the resonator of the first embodiment, and FIG. 10B is a diagram of a pass characteristic of the resonator of the first comparative example. In FIGS. 9A through 10B, data measured at different position on the same substrate are over-written in order to see differences on the substrate. In both the first embodiment and the first comparative example, a spurious component 40 is observed at a frequency of around 1877 MHz. The spurious component 40 observed in the first embodiment is smaller than that in the first comparative example. The first embodiment has fine spurious components 42 in the range of of 1880 MHz to 1960 MHz, which are smaller than those in the first comparative example. The first embodiment has suppressed spurious components, as compared to the first comparative example.

A resonator in accordance with a first variation of the first embodiment is described. In the present resonator, the arrangements of the first pattern 32 and the second pattern 34 are as illustrated in FIG. 5D, and the first pattern 32 and the second pattern 34 are formed by the mass loading film 28 having the holes. The resonance portion 50 has an ellipsoidal shape having a long-axis length of 247 μm and a short-axis length of 176 μm. The first pattern 32 has the circular dots. The pattern pitch Lp of the first pattern 32 is 7 μm, and the pattern size L1 thereof is 1.7 μm. The width W of the second pattern is 1.5 μm. The coverage ratio is 80%. In a second comparative example, the second pattern 34 is arranged so as to form the same pattern as that of the first variation, and the first pattern 32 is not formed. The width W of the second pattern 34 is 1.7 μm. In a third comparative example, the first pattern 32 is arranged so as to form the same pattern as that of the first variation, and the second pattern 34 is not formed. The size L1 of the first pattern 32 is 2.5 μm. The resonance portions 50 of the second and third comparative examples have the same size as that of the first variation of the first embodiment. The coverage ratios of the first variation and the second and third comparative examples are 80%.

Figure 11A:
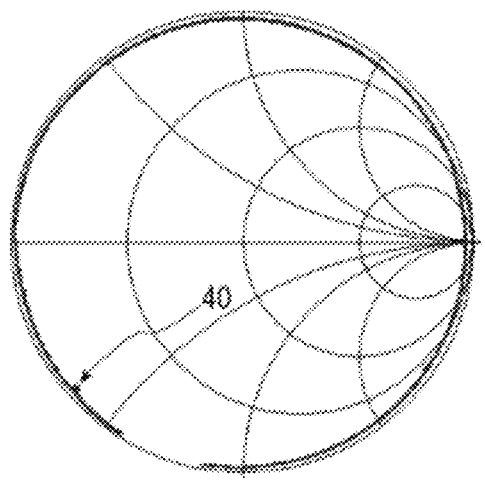
FIGS. 11A through 11C are Smith charts of the reflection characteristics of resonators of a first variation of the first embodiment, a second comparative example, and a third comparative example, respectively.
Figure 11B:
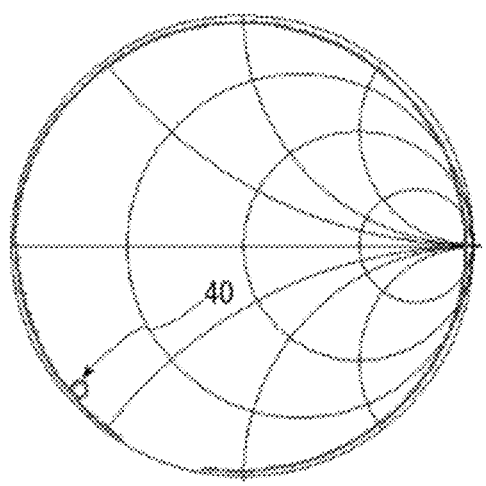
Figure 11C:
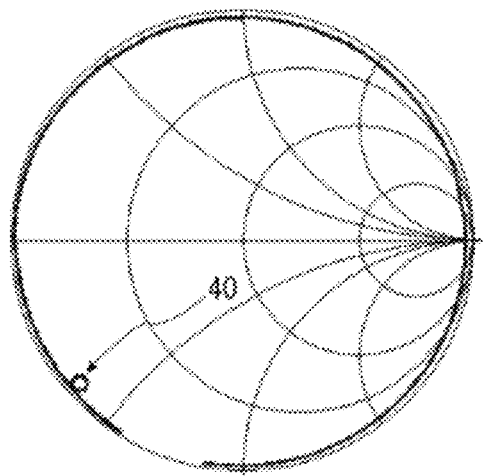
Figure 12A:
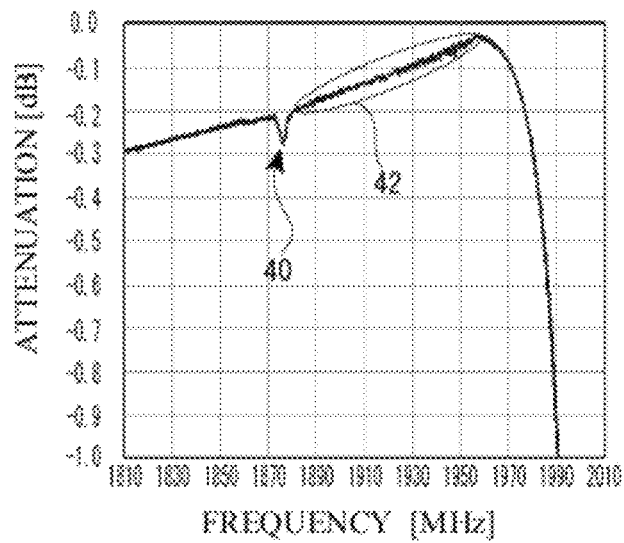
FIGS. 12A through 12C are diagrams of the pass characteristics of resonators of a first variation of the first embodiment, the second comparative example, and the third comparative example, respectively.
Figure 12B:
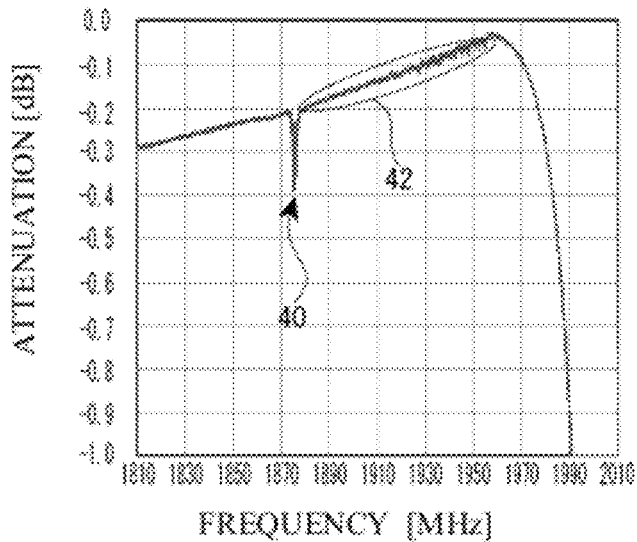
Figure 12C:
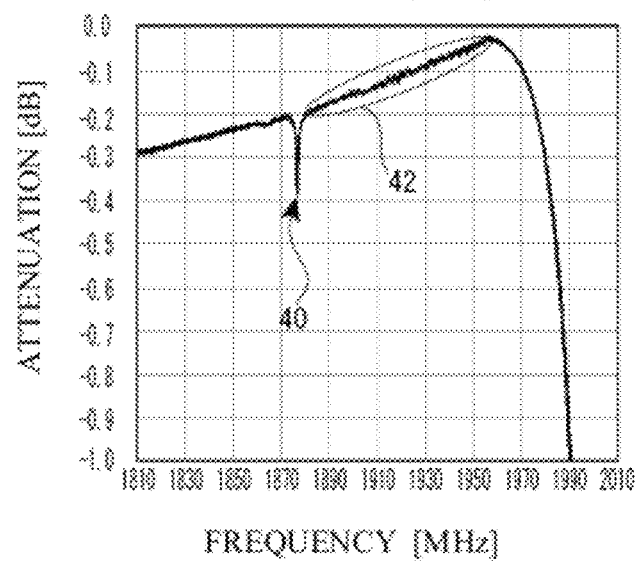

FIGS. 11A through 11C are respectively Smith charts of reflection characteristics of the resonators configured in accordance with the first variation, the second comparative example, and the third comparative example. FIGS. 12A through 12C are respectively diagrams of pass characteristics of the resonators configured in accordance with the first variation, the second comparative example, and the third comparative example. As illustrated in FIGS. 11A through 12C, the spurious component 40 is observed at a frequency of around 1877 MHz in each of the resonators. Further, the fine spurious components 42 are observed in the range of 1880 MHz to 1960 MHz. It is to be noted the spurious components 40 and 42 of the first variation of the first embodiment are smaller than those of the second and third comparative examples. The first variation is capable of suppressing the spurious components, as compared to the second and third embodiments.

According to an experiment conducted by the inventors, in a case where the mass loading film 28 has only the first pattern 32, the spurious components 40 and 42 become larger as the size L1 of the first pattern 32 becomes larger. Even in a case where the mass loading film 28 has only the second pattern 34, the spurious components 40 and 42 become larger as the width W of the second pattern 34 becomes larger. According to the first embodiment, the combination of the first pattern 32 and the second pattern 34 makes it possible to reduce the size L1 of the first pattern 32 and the width W of the second pattern 34 even for the same coverage ratio. Thus, the spurious components 40 and 42 can be suppressed.

Figure 13:
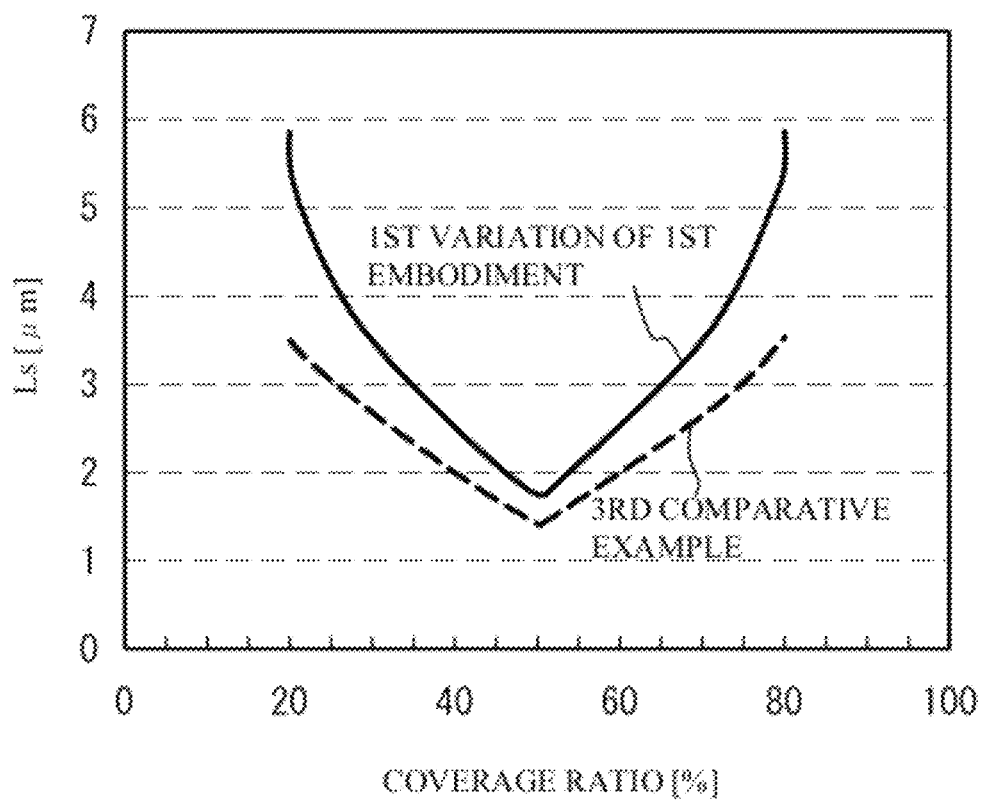
FIG. 13 is a diagram of relationships between the coverage ratios and the pattern intervals Ls in the first variation of the first embodiment and the third comparative example.

FIG. 13 is a diagram of a relationship between the coverage ratio and the pattern interval Ls in each of the first variation of the first embodiment and the third comparative example. The first variation is depicted by a solid line, and the third comparative example is depicted by a broken line. When the coverage ratio is equal to or less than 50%, the pattern is formed by the mass loading film 28. When the coverage ratio is higher than 50%, the pattern is formed by the holes formed in the mass loading film 28. In the first variation of the first embodiment, the coverage ratio is calculated by changing the size L1 of the first pattern 32 under the condition that the pattern pitch Lp is fixed to 7 μm and the width W of the second pattern 34 is fixed to 1.5 μm. In the third comparative example, the coverage ratio is calculated by changing the size L1 of the first pattern 32 under the condition that the pattern pitch is fixed to 7 μm.

As illustrated in FIG. 13, the first variation of the first embodiment is capable of increasing the pattern interval Ls for the same coverage ratio, as compared with the third comparative example Particularly, when the coverage ratio is about 20% or 80%, the pattern interval Ls can be increased. The patterned mass loading film 28 may be formed by the evaporation or sputtering technique of forming the mass loading film 28, and photolithography and etching techniques. The patterned mass loading film 28 may be formed by the photolithography technique, the sputtering or evaporation technique of forming the mass loading film 28 and the liftoff technique. Thus, as the pattern interval Ls becomes smaller, it becomes more difficult to form the patterned mass loading film 28. In the structures disclosed in Documents 2 and 3, the pattern interval Ls of the mass loading film is required to be shorter than the wavelength of the acoustic wave defined for the operation of the resonator. More specifically, Documents 2 and 3 disclose that the acoustic wavelength of the piezoelectric thin-film material at a frequency of 1 GHz is within the range of 5 μm to 10 μm, and the pattern interval Ls is equal to or smaller than the lower limit of the range. Paradoxically, when the pattern size L1 or the pattern interval Ls becomes considerably larger than the wavelength of the acoustic wave, it becomes difficult for the mass loading film to show the original function. According to an experiment conducted by the inventors, a spurious component is generated and a deterioration of the characteristics is caused when the pattern size L1, the pattern interval Ls, or the pattern pitch Lp becomes considerably larger than the wavelength of the acoustic wave. Such a mass loading film may not show the original function and may be not suitable for practical use. When it is attempted to increase the resonance frequency of the resonator (not less than 1 GHz or 2 GHz), the pattern interval Ls becomes small and it become difficult to produce the mass loading film. In other words, the range in which the coverage ratio can be varied becomes narrow within the producible range. Therefore, the frequency adjustable range becomes narrow. The first variation of the first embodiment is capable of realizing a larger pattern interval than that of the third comparative example. Therefore, it is easier to manufacture the acoustic wave device. In other words, the range in which the coverage ratio can be varied becomes wider within the producible range. It is thus possible to widen the frequency adjustable range.

The first embodiment and its variation have the mass loading film 28 formed by the first pattern 32 having the dots and the second pattern 34 having the arms connecting the dots. With this structure, it is possible to suppress the spurious level, as illustrated in FIGS. 9A through 12C. Further, as illustrated in FIG. 13, it is possible to widen the range in which the coverage ratio can be changed within the producible range. Although the resonator having a resonance frequency of about 2 GHz is used in FIGS. 9A through 12C, similar effects can be obtained when resonators having different resonance frequencies are used. As the resonance frequency becomes higher, the wavelength of the acoustic wave becomes shorter. Therefore, the first pattern 32 and the second pattern 34 have smaller sizes. It is useful to use the resonator of the first embodiment when the resonance frequency is high. For example, the use of the resonator of the first embodiment is advantageous when the resonance frequency is equal to or higher than 1 GHz, 1.5 GHz or 2 GHz.

It is preferable that the width W of the arms of the second pattern 34 is smaller than the size L1 of the dots of the first pattern 32. This is because the first embodiment and its variation may have structures closer to the first and second comparative examples when the width W of the second pattern 34 is larger than the size L1 of the dots of the first pattern 32.

The first pattern 32 may have an irregular arrangement of dots or a random arrangement. However, it is preferable that the dots of the first pattern 32 are arranged regularly. The regular arrangement of dots makes it possible to equalize the performance of the acoustic wave in the resonance portion 50. The arms of the second pattern 34 may be arranged irregularly. However, it is preferable that the arms of the second pattern 34 are arranged regularly.

The dots of the first pattern 32 may have different shapes in the resonance portion 50. However, it is preferable that the dots of the first pattern 32 have the same shape in the resonance portion 50. It is thus possible to equalize the performance of the acoustic wave in the resonance portion 50.

The arms of the second pattern 34 may have different widths in the resonance portion 50. However, it is preferable that the arms of the second pattern 34 have the same width in the resonance portion 50. It is thus possible to equalize the performance of the acoustic wave in the resonance portion 50.

The mass loading film 28 is preferably made of a substance different from that used for the lower electrode 12 or the upper electrode 16. It is thus possible to secure an appropriate etching selection ratio of the mass loading film 28 to the lower electrode 12 or the upper electrode 16 at the time of forming the pattern in the mass loading film 28.

In the filter illustrated in FIG. 1, at least two of the resonators may be configured to have a different ratio of the first pattern 32 and the second pattern 34 to the resonance portion 50. This configuration makes it possible to adjust the resonance frequency for each resonator. In this case, it is preferable that the mass loading films 28 of the at least two resonators have the same film thickness. This is because the mass loading films 28 may be formed concurrently.

For example, the series resonators S1~S4 may be varied so as to have different ratios of the first pattern 32 and the second pattern 34 to the resonance portion 50. This variation makes it possible for the series resonators S1~S4 to have different resonance frequencies. This variation may be applied to the parallel resonators P1~P3. The mass loading films 20 are used to define large differences in the resonance frequency between the series resonator S1~S4 and the parallel resonators P1~P3, and the mass loading films 28 are used to define fine differences in the resonance frequency between the series resonators S1~S4 or those between the parallel resonators P1~P3. Therefore, it is possible to realize the fine adjustment of the resonance frequency of each resonator without increasing the number of manufacturing steps. The fine adjustment of the resonance frequency of each resonator realizes low insertion loss and wideband filters.

Second Embodiment

Figure 14A:
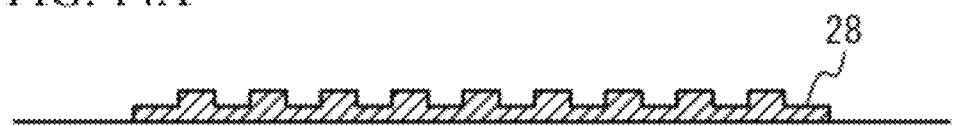
FIGS. 14A and 14B are cross-sectional views of mass loading films of a second embodiment.
Figure 14B:

FIGS. 14A and 14B are cross-sectional views of a mass loading film of a second embodiment. As illustrated in FIG. 14A, a part of the mass loading film 28 illustrated in FIG. 3B is left. The dots of the first pattern 32 and the arms of the second pattern 34 are comparatively thick portions of the mass loading film 28. As illustrated in FIG. 14B, a part of the mass loading film illustrated in FIG. 4B is left. The dots of the first pattern 32 and the arms of the second pattern 34 are comparatively thin portions of the mass loading film 28.

Third Embodiment

Figure 15A:
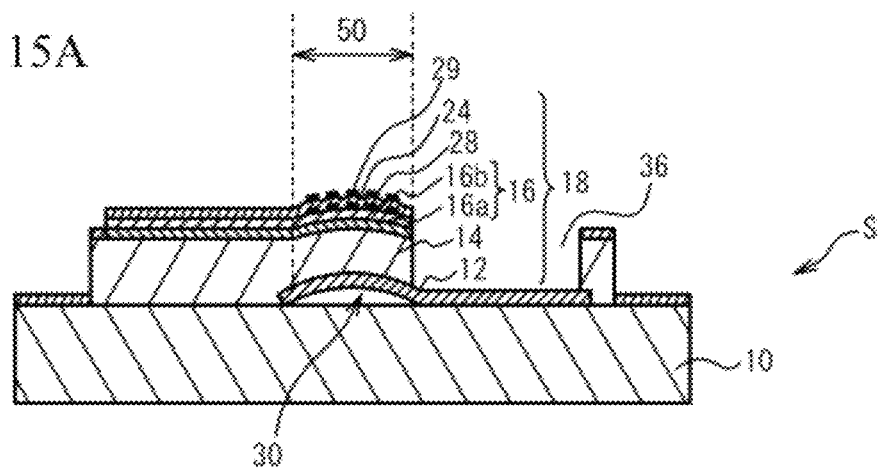
FIG. 15A is a cross-sectional view of a series resonator of a third embodiment.
Figure 15B:
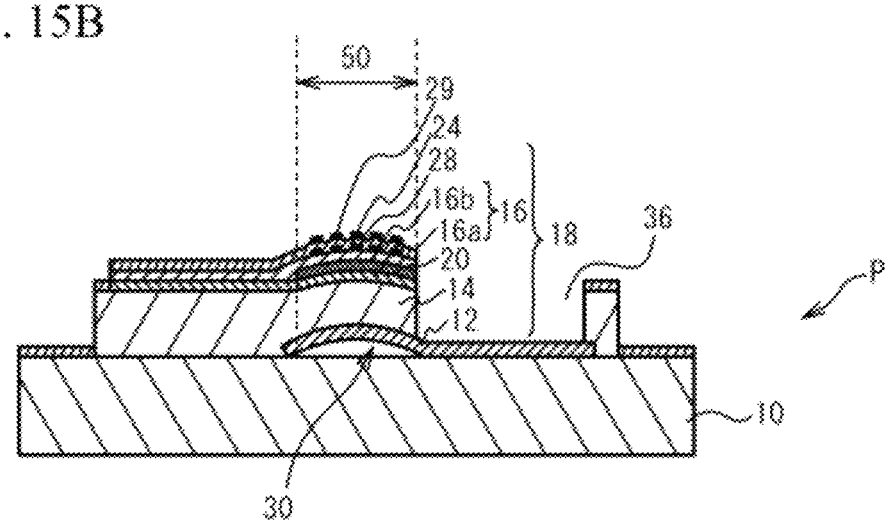
FIG. 15B is a cross-sectional view of a parallel resonator of the third embodiment.

A third embodiment has an exemplary structure having a plurality of mass loading films. FIG. 15A is a cross-sectional view of a series resonator of the third embodiment, and FIG. 15B is a cross-sectional view of a parallel resonator of the third embodiment. As illustrated in FIGS. 15A and 15B, another mass loading film 29 is formed on the frequency adjustment film 24. Like the mass loading film 28, the mass loading film 29 has the first pattern 32 and the second pattern 34.

In the first and second embodiments, when it is attempted to broaden the range in which the resonance frequency is adjusted by the single-layer mass loading film 28, the mass loading film 28 is relatively thick. According to an experiment conducted by the inventors, as the mass loading film 28 is thicker, the resonator has a worse resonance characteristic. According to the third embodiment, each of the mass loading film 28 and 29 is composed of a plurality of layers. This makes it possible for each layer to have a reduced thickness and suppresses the deterioration of the resonance characteristic of the resonator. The mass loading film 29 may be formed in the multilayer film 18 in the resonance portion 50. The mass loading film 29 may be composed of three layers or more.

Fourth Embodiment

Figure 16:
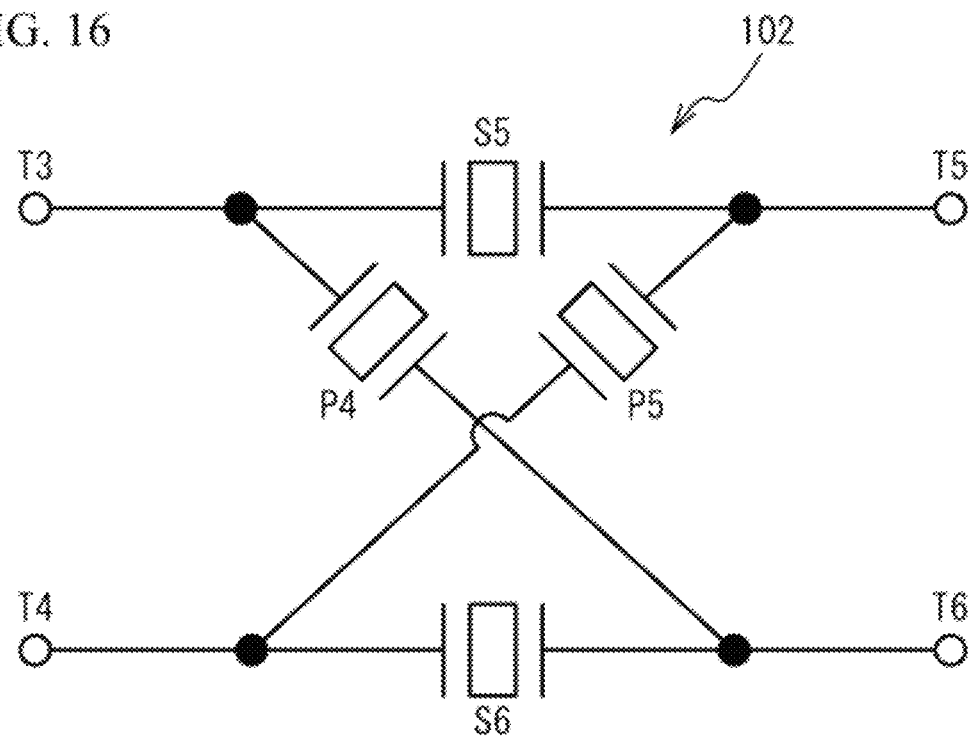
FIG. 16 is a circuit diagram of an exemplary lattice type filter in accordance with a fourth embodiment.

A fourth embodiment is an exemplary lattice type filter. FIG. 16 is a lattice type filter in accordance with a fourth embodiment. Referring to FIG. 16, a lattice type filter 102 is composed of series resonators S5 and S6 and parallel resonators P4 and P5. A series resonator S5 is connected between terminals T3 and T5, and a series resonator S6 is connected between terminals T4 and T6. A parallel resonator P4 is connected between the terminals T3 and T6, and a parallel resonator P5 is connected between the terminals T4 and T5. The series resonators S5 and S6 and the parallel resonators P4 and P5 may be any of the series resonators and the parallel resonators of the first through third embodiments. The lattice type filter 102 thus configured has a suppressed spurious level as in the case of the ladder type filter. Further, the lattice type filter 102 has a wide frequency adjustable range. The resonators of the first through third embodiments may be applied to filters other than the ladder type filter and the lattice type filter.

Fifth Embodiment

Figure 17:
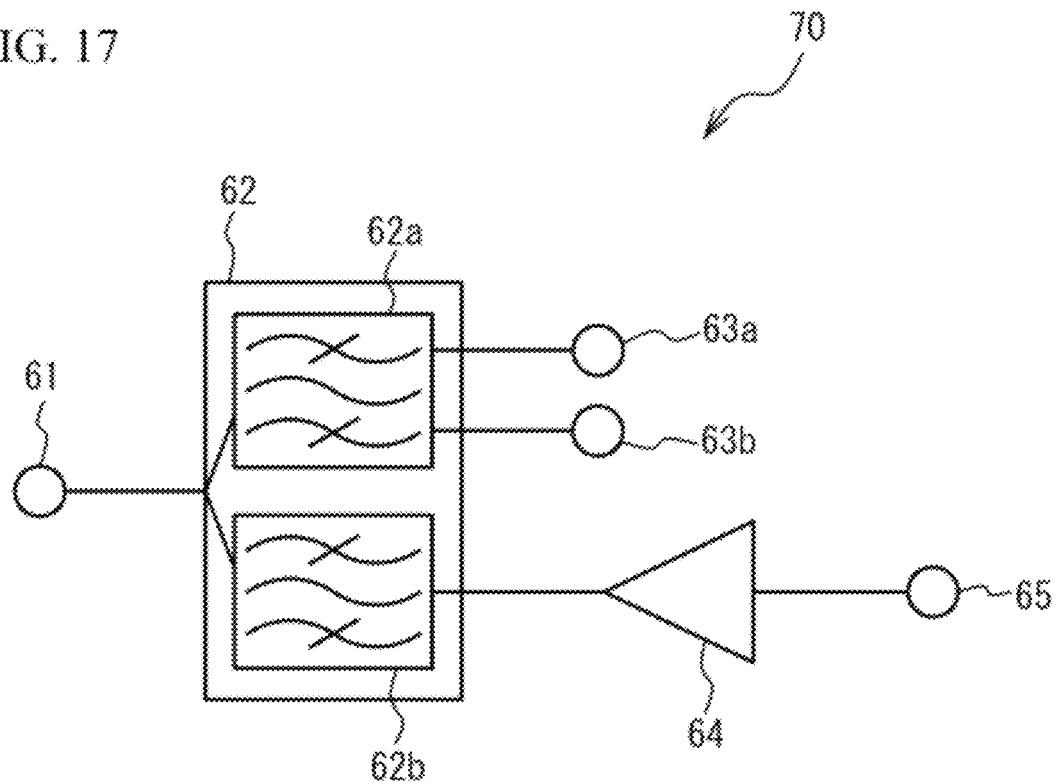
FIG.17 is a block diagram of a fifth embodiment.

A fifth embodiment is an exemplary RF (Radio Frequency) module for mobile communications. FIG. 17 is a block diagram of the fifth embodiment. Referring to FIG. 17, a module 70 has a duplexer 62 and a power amplifier 64. The duplexer 62 has a reception filter 62a and a transmission filter 62b. The reception filter 62a is connected between an antenna terminal 61 and reception terminals 63a and 63b. The reception filter 62a passes signals in a reception band among signals received via the antenna terminal 61, and suppresses the remaining signals. The signals in the reception band are output via the reception terminals 63a and 63b as balanced signals. The transmission filter 62b is connected between the power amplifier 64 and the antenna terminal 61. The power amplifier 64 amplifies a signal received via a transmission terminal 65, and outputs an amplified signal to the transmission filter 62b. At least one of the reception filter 62a and the transmission filter 62b may include the filter of any of the first through fourth embodiments.

As the piezoelectric thin-film resonator, the aforementioned first through third embodiments employ the FBAR in which the cavity 30 is formed between the multilayered film 18 and the substrate 10 in the resonance portion 50. Another type of piezoelectric thin-film resonator may be used. For example, a hole is formed in the substrate and the multilayered film 18 is exposed to the hole. An acoustic reflection film may be substituted for the cavity in the substrate. This kind of resonator is solidly mounted resonator (abbreviated as SMR). The acoustic reflection film may be formed by alternately stacking a first film having a relative low acoustic impedance and a second film having a relative high acoustic impedance so as to realize a film thickness corresponding to the wavelength of the acoustic wave.

The present invention is not limited to the specifically described embodiments and variations, but other embodiments and variations may be made without departing from the scope of the claimed invention.

What is claimed is:

1. An acoustic wave device comprising:
a substrate;
a piezoelectric film formed on the substrate;
a lower electrode provided on a first surface of the piezoelectric film;
an upper electrode provided on a second surface of the piezoelectric film opposite to the first surface; and
a mass loading film having a first pattern and a second pattern in a resonance portion in which the lower electrode and the upper electrode face each other through the piezoelectric film,
the first pattern having portions and the second pattern having portions interlinking the portions of the first pattern,
wherein the portions of the second pattern have a width smaller than that of the portions of the first pattern,
wherein the first pattern and the second pattern in the resonance portion are defined by a single pattern, and a complementary pattern of the first pattern and the second pattern in the resonance portion are defined by a single pattern.

2. The acoustic wave device according to claim 1, wherein adjacent portions among the portions of the first patterns are interlinked by a single portion among the portions of the second pattern.

3. The acoustic wave device according to claim 1, wherein the portions of the first pattern are arranged regularly.

4. The acoustic wave device according to claim 1, wherein the portions of the first pattern have an identical shape.

5. The acoustic wave device according to claim 1, wherein the portions of the second pattern have an identical width.

6. The acoustic wave device according to claim 1, wherein the first pattern and the second pattern are defined by the mass loading film.

7. The acoustic wave device according to claim 1, wherein the first pattern and the second pattern are defined by openings formed in the mass loading film.

8. The acoustic wave device according to claim 1, wherein the mass loading film is made of a material different from that of the lower electrode or the upper electrode.

9. The acoustic wave device according to claim 1, wherein the mass loading film includes films, each of which has the first pattern and the second pattern.

10. A filter comprising an acoustic wave device including:
a substrate;
a piezoelectric film formed on the substrate;
a lower electrode provided on a first surface of the piezoelectric film;
an upper electrode provided on a second surface of the piezoelectric film opposite to the first surface; and
a mass loading film having a first pattern and a second pattern in a resonance portion in which the lower electrode and the upper electrode face each other through the piezoelectric film,
the first pattern having portions and the second pattern having portions interlinking the portions of the first pattern,
wherein the portions of the second pattern have a width smaller than that of the portions of the first pattern,
wherein the first pattern and the second pattern in the resonance portion are defined by a single pattern, and a complementary pattern of the first pattern and the second pattern in the resonance portion are defined by a single pattern.

11. The filter according to claim 10, wherein adjacent portions among the portions of the first patterns are interlinked by a single portion among the portions of the second pattern.

12. An acoustic wave device comprising:
a substrate;
a piezoelectric film formed on the substrate;
a lower electrode provided on a first surface of the piezoelectric film;
an upper electrode provided on a second surface of the piezoelectric film opposite to the first surface; and
a mass loading film having a first pattern and a second pattern in a resonance portion in which the lower electrode and the upper electrode face each other through the piezoelectric film,
the first pattern having portions and the second pattern having portions interlinking the portions of the first pattern,
wherein the first pattern and the second pattern are defined by openings formed in the mass loading film,
wherein the first pattern and the second pattern in the resonance portion are defined by a single pattern, and a complementary pattern of the first pattern and the second pattern in the resonance portion are defined by a single pattern.

13. The acoustic wave device according to claim 12, wherein the portions of the first pattern are arranged regularly.

14. The acoustic wave device according to claim 12, wherein the portions of the first pattern have an identical shape.

15. The acoustic wave device according to claim 12, wherein the portions of the second pattern have an identical width.

16. The acoustic wave device according to claim 12, wherein the mass loading film includes films, each of which has the first pattern and the second pattern.

17. The acoustic wave device according to claim 12, wherein adjacent portions among the portions of the first patterns are interlinked by a single portion among the portions of the second pattern.

* * * * *